(12) United States Patent
Aoki

(10) Patent No.: US 6,387,821 B1
(45) Date of Patent: *May 14, 2002

(54) METHOD OF MANUFACTURING A SEMICONDUCTOR DEVICE

(75) Inventor: Hidemitsu Aoki, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/409,143

(22) Filed: Sep. 30, 1999

(30) Foreign Application Priority Data

Oct. 5, 1998 (JP) .............................. 10-282863

(51) Int. Cl.$^7$ ........................................... H01L 21/302
(52) U.S. Cl. ..................... 438/745; 438/747; 438/754
(58) Field of Search ................. 438/690, 692, 438/691, 694, 697, 698, 700, 704, 706, 745, 754, 747

(56) References Cited

U.S. PATENT DOCUMENTS

| | | | |
|---|---|---|---|
| 5,354,712 A | 10/1994 | Ho et al. | |
| 5,451,551 A | 9/1995 | Krishnan et al. | |
| 5,891,513 A | * 4/1999 | Dubin et al. .................... | 427/98 |
| 5,969,422 A | * 10/1999 | Ting et al. .................... | 257/762 |
| 5,985,762 A | * 11/1999 | Geffken et al. ............. | 438/687 |
| 5,989,353 A | * 11/1999 | Skee et al. ...................... | 134/2 |
| 5,989,623 A | * 11/1999 | Chen et al. .................... | 427/97 |
| 6,007,733 A | * 12/1999 | Jang et al. ..................... | 216/80 |

FOREIGN PATENT DOCUMENTS

| | | |
|---|---|---|
| EP | 0 678 571 | 10/1995 |
| JP | 10-72594 | 3/1998 |
| JP | 10-261715 | 9/1998 |

\* cited by examiner

Primary Examiner—Benjamin L. Utech
Assistant Examiner—Binh X Tran
(74) Attorney, Agent, or Firm—Rosenman & Colin LLP

(57) ABSTRACT

In a method of manufacturing a semiconductor device having a multi-layer interconnection, after a via hole has been formed, the inside of the via hole is cleaned using a cleaning solution containing a complexing agent capable of forming a complex with contaminants of copper type metals.

10 Claims, 16 Drawing Sheets

(a)

(b)

(c)

(d)

(a)

(b)

(a)

(b)

(a)

(b)

(a)

(b)

(c)

(d)

(a)

(b)

(a)

(b)

(a)

(b)

(a)

(b)

(a)

(b)

(c)

(a)

(b)

METHOD OF MANUFACTURING A SEMICONDUCTOR DEVICE

BACKGROUND OF THE INVENTION

1. Field of the Invention

The present invention relates to a method of manufacturing a semiconductor device having a multi-layer interconnection connecting an upper wiring and a metal wiring made of a copper type metal material, through a via hole.

2. Description of the Relates Art

A representative example of the conventional process for production of a semiconductor device having a multi-layer interconnection is described with reference to FIGS. 5 to 8. This example is a so-called dual damascene process wherein a lower wiring and an upper wiring are each formed so as to have a damascene interconnection.

On a semiconductor substrate (not shown) on which a device (e.g. transistor) has been formed, are formed a silicon oxide film 201 having a thickness of 100 nm and a HSQ (hydrogen silsesquioxane) film 202 having a thickness of 400 nm. Successively, thereon is formed a photoresist mask 203 having a predetermined pattern [FIG. 5(*a*)]. Dry etching is conducted using this mask to form, in the HSQ film 202, a groove for formation of buried lower wiring. Successively, ashing by oxygen plasma and cleaning by a cleaning solution containing an amine compound are conducted to peel the photoresist mask 203 [FIG. 5(*b*)]. conducted to peel the photoresist mask 203 [FIG. 5(*b*)].

Next, on the whole surface of the resulting substrate is formed, by sputtering, a TiN 204 film (thickness: 50 nm) as a barrier metal film. Thereon is formed a copper film 205 by sputtering, to fill the groove [FIG. 5(*c*)]. Successively, CMP (chemical mechanical polishing) is conducted to remove the unnecessary portions of the TiN film 204 and the copper film 205, formed outside the groove, to complete a lower wiring [FIG. 5(*d*)].

After the formation of the lower wiring, an HSQ film 206 having a thickness of 1,200 nm is formed by coating and subsequent firing. Thereon is formed a resist mask 207 having a pattern of via holes (diameter: 0.25 μm) [FIG. 6(*a*)]. Dry etching is conducted using this resist mask 207 to form part of a via hole in the HSQ film 206. The dry etching is stopped before the bottom of the via hole formed reaches the copper film 205. As the etching gas, there is used, for example, a mixed gas containing $C_4F_8$ and Ar, or a mixed gas further containing $O_2$. Successively, ashing by oxygen plasma and cleaning by a cleaning solution containing an amine compound are conducted to peel the resist mask 207 [FIG. 6(*b*)].

Next, a resist mask 208 is formed on the HSQ film 206 [FIG. 7(*a*)]. The width of opening of the resist mask 208 is made larger than the diameter of the resist mask 207 of FIG. 6(*a*). Dry etching is conducted using this resist mask 208, to form a hole having a T-shaped section in the HSQ film 206. As the etching gas, there is used, for example, a mixed gas containing $C_4F_8$ and Ar, or a mixed gas further containing $O_2$. Successively, ashing by oxygen plasma and cleaning by a cleaning solution containing an amine compound are conducted to peel the resist mask 208 [FIG. 7(*b*)].

Next, on the whole surface of the resulting substrate is formed, by sputtering, a TiN film 209 (thickness: 50 nm) as a barrier metal film. Thereon is formed a copper film 211 by sputtering, to fill the hole having a T-shaped section [FIG. 8(*a*)]. Successively, the unnecessary portions of the TiN film 209 and the copper film 211, formed outside the hole are removed by CMP to complete an upper wiring (corresponding to the top of the T-shaped hole) and a via plug [FIG. 8(*b*)].

In the above-mentioned conventional production process, however, there have been cases that a leakage current flows in the inter-layer insulating film formed or the device (e.g. transistor) formed beneath the inter-layer insulating film causes malfunctioning.

The present inventor made an in-depth study on the causes of such phenomena and found out that contaminants consisting of copper and copper compounds remain on the inner walls of the via hole and groove for buried wiring both formed in the inter-layer insulating film and these contaminants cause the above phenomena.

In etching the inter-layer insulating film formed on a lower wiring, to form a via hole,the necessity of overetching invites partial etching of the copper constituting the lower wiringand generates metal contaminants. These metal contaminants ordinarily adhere to the inner walls of via hole, etc. in the form of a compound formed by a chemical reaction of copper with an etching gas component. The contaminants are impossible to remove by conventional cleaning using, for example, a cleaning solution containing an amine compound; therefore, formation of barrier metal film on inner walls of via hole, etc. is inevitably conducted in a state that the contaminants remain on the inner walls of via hole, etc. The contaminants remaining on the inner walls of via hole, etc., when placed in an electric field or heated, diffuse into the inter-layer insulating film, causing various problems such as current leakage and the like.

The phenomena are explained with reference to FIG. 9. In FIG. 9, on a silicon substrate 223 is formed a MOSFET comprising a source region 225, a drain region 226 and a gate electrode 224. The source region 225 is connected to a lower wiring consisting of a copper film 205, via a contact hole 221. This lower wiring is connected to a via hole 211 (including an upper wiring) consisting of a tungsten film. To the inner walls of the via hole and the buried wiring both formed in an HSQ film 206 adhere the metal contaminants 212 formed by the partial etching of the copper film 205constituting the lower wiring. The metal contaminants 212, when undergoing heat history or placed in an electric field, migrate like the arrow marks shown in FIG. 9, reach a device (e.g. transistor) and allow the device to malfunction, or stay in the inter-layer insulating film and generate a leakage current.

These problems do not appear when aluminum is used as a material for wiring, but appear when a copper type metal is used as a material for wiring. It is because copper, as compared with aluminum, is significantly large in diffusion rate in insulating film.

To form a multi-layer. interconnection free from the above problems, it is necessary to conduct, after the formation.of a via hole and a buried wiring, cleaning which is different from conventional cleaning using, for example, a cleaning solution containing an amine compound. Since such cleaning aims at (1) cleaning the inside of via hole, (2) removing the metal contaminants which have adhered on the exposed surface of inter-layer insulating film, and (3) removing the metal contaminants which have adhered after dry etching, the cleaning has requirements different from those in the other steps of semiconductor device production. Description is made on this below.

Firstly, the above cleaning aims at cleaning the inside of via hole. Therefore, the shear force of the flow of cleaning solution does not easily reach the inside of via hole which is an area to be cleaned. Substantially no shear force is produced there particularly when the via hole formed has a small diameter. Thus, no physical cleaning action is expected and it is necessary to conduct sufficient cleaning by chemical cleaning action alone.

If mismatching of photoresist occurs at the time of via hole formation, there are cases that the portion of the HSQ film contacting with the lower wiring and facing the formed via hole, formed as a result of the mismatching is etched and a slit is formed at the portion (FIG. 16). In such a slit, no circulation of cleaning solution hardly takes place and cleaning under very sever conditions is necessary.

Secondly, the above cleaning aims at removing the copper type metal contaminants which have adhered on the exposed surface of inter-layer insulating film. Therefore, there naturally is a restriction as to the kind of the cleaning solution used. In recent years, a material of low dielectric constant has been widely used for the inter-layer insulating film of semiconductor device. As the material of low dielectric constant, there is preferably used a SOG (spin-on-glass) film, particularly a HSQ film. With such a film, the exposed surface thereof causes property change depending upon the kind of the cleaning solution used, resulting in increased dielectric constant. Therefore, it is necessary to select a cleaning solution which does not adversely affect the dielectric constant of SOG film or the like. Further, the metal contaminants of copper type compounds which have adhered on the exposed surface of SOG film or the like, have high adhesivity to the surface, making very difficult the cleaning thereof.

Thirdly, the above cleaning aims at removing the copper type metal contaminants which have adhered after dry etching. Therefore, the cleaning of such metal contaminants must be conducted by an action different from that employed in removal of metal contaminants consisting of ordinary metals or oxides thereof. As mentioned above, the above cleaning aims at removing the metal contaminants generated, at the time of via hole formation, by the partial etching of the copper constituting the lower wring. These contaminants are in the form of a compound formed by a chemical reaction of copper with an etching gas component, have high adhesivity to inter-layer insulating film, particularly SOG film, and are difficult to remove by conventional cleaning for via hole inside.

As described above, to form a multi-layer interconnection free from current leakage, etc., it is necessary to conduct, after the formation of via hole and buried wiring, cleaning different from the conventional cleaning using, for example, a cleaning solution containing an amine compound.

For the removal of metal contaminants present inside via hole, cleaning by DHF (dilute hydrofluoric acid) is considered as one method. With this method, copper type metal contaminants can be removed to a certain extent, but no sufficient removal is obtained. Further, DHF causes etching of inter-layer insulating film, resulting in enlarged hole diameter. Enlargement of hole diameter is striking particularly when a SOG film is used.

The present invention has been completed in order to alleviate the above problems, and aims at sufficiently removing the copper type metal contaminants which have adhered to the inner walls of via hole and groove for buried wiring and thereby alleviating the current leakage in multi-layer interconnection and the malfunctioning of device.

SUMMARY OF THE INVENTION

According to the present invention, there is provided a method of manufacturing a semiconductor device comprising the steps of:

(A) a step of forming, on a semiconductor substrate, a metal wiring made of a metal material containing copper or a copper alloy, (B) a step of forming an inter-layer insulating film on the metal wiring, (C) a step of forming, at a predetermined position of the inter-layer insulating film, a via hole reaching the metal wiring by dry etching, (D) a step of removing contaminants which consist of the metal material and/or the compound(s) thereof and which have adhered to the inner wall of the via hole as a result of the dry etching, by using a cleaning solution containing a complexing agent capable of forming a complex with the contaminants,.

(E) a step of forming a barrier metal film on the inner wall of the via hole and then forming an electrically conductive film on the whole surface of the resulting substrate so as to fill the via hole, and (F) a step of removing the unnecessary portions of the electrically conductive film and the barrier metal film, formed outside the via hole, by etching or chemical mechanical polishing to obtain a flat surface.

In the present method of manufacturing a semiconductor device, the dry etching conducted in the step (C) invites adhesion of metal contaminants to the inner wall of the via hole formed by the dry etching. These contaminants are generated as a result of the etching of the metal material containing copper or a copper alloy, constituting the metal wiring, and are composed mainly of copper, a copper oxide(s) and a reaction product of copper and an etching gas.

The contaminants containing the oxide(s) and the reaction product of copper and an etching gas, adhering to the inner wall of the inter-layer insulating film are generally difficult to remove. In the present invention, the inner wall of via hole is cleaned using a cleaning solution containing a complexing agent capable of forming a complex with the above-mentioned contaminants, whereby the above-mentioned problems are solved.

According to the present invention, there is also provided a method of manufacturing a semiconductor device having a copper wiring, which comprises, after formation of a via hole, cleaning the inside of the via hole using a cleaning solution containing a complexing agent capable of forming a complex with contaminants of copper type metals.

In the, present invention, the "copper type metals" refer to metals consisting of copper and compounds thereof; and the "contaminants of copper type metals" refer to contaminants generated during the formation of via hole as a result of, for example, dry etching. In the present invention, these contaminants can be easily removed because they are cleaned using a cleaning solution containing a complexing agent capable of forming a complex with the contaminants.

DETAILED DESCRIPTION OF THE PREFERRED EMBODIMENTS

Figure 1:
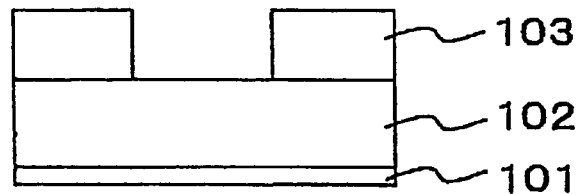
FIG. 1 is sectional views showing steps of the present method of manufacturing a semiconductor device.
Figure 1:
Figure 1:
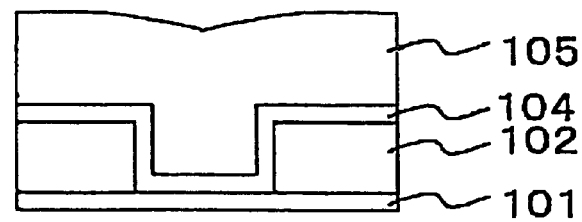
Figure 1:
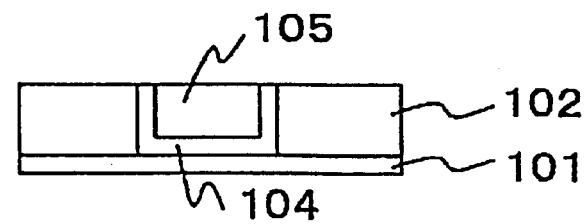
Figure 2:
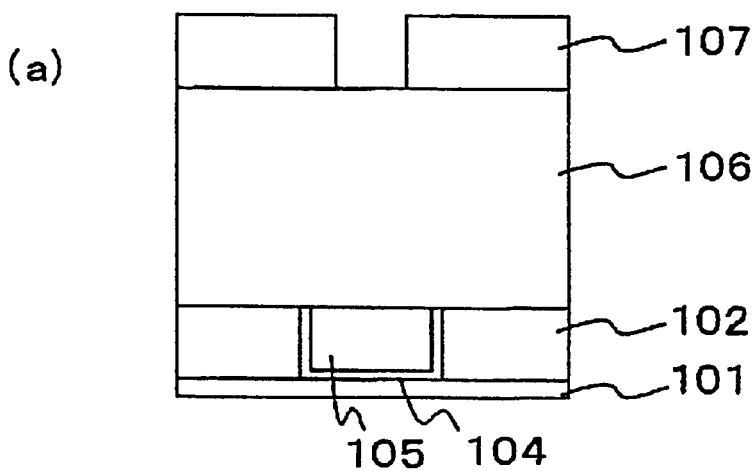
FIG. 2 is sectional views showing steps of the present method of manufacturing a semiconductor device.
Figure 2:
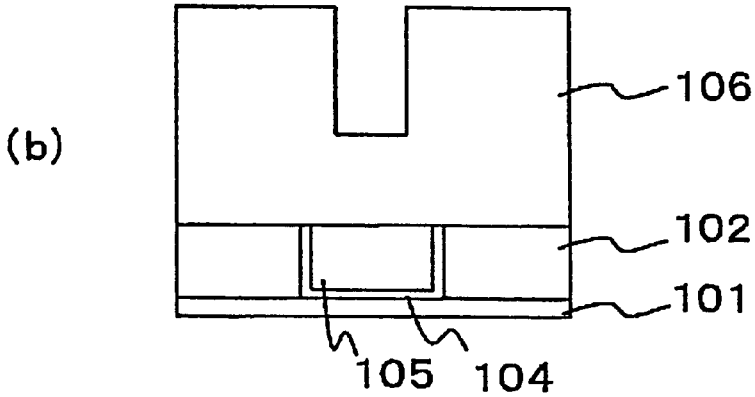
Figure 3:
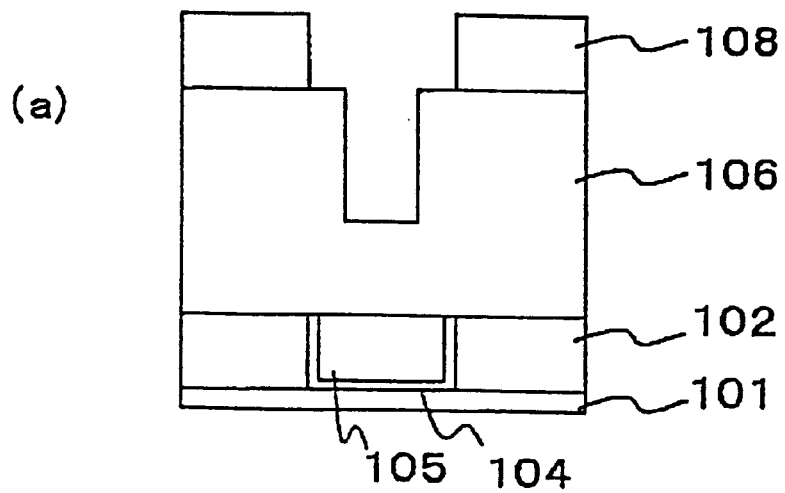
FIG. 3 is sectional views showing steps of the present method of manufacturing a semiconductor device.
Figure 3:
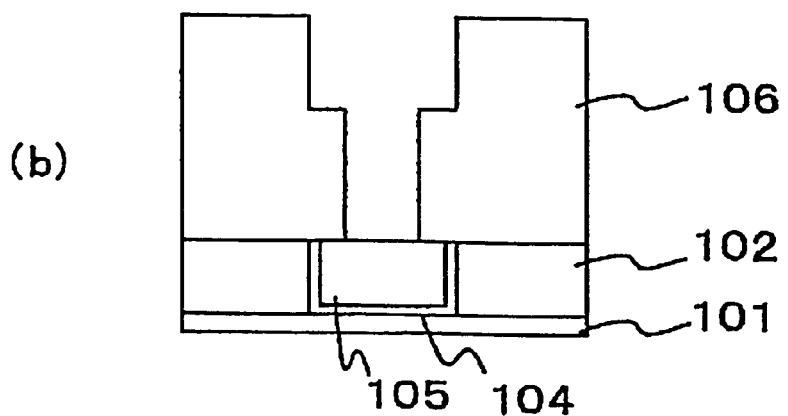
Figure 4:
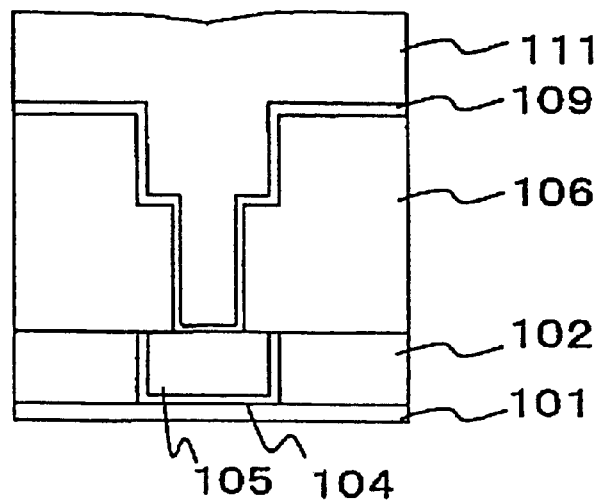
FIG. 4 is sectional views showing steps of the present method of manufacturing a semiconductor device.
Figure 4:
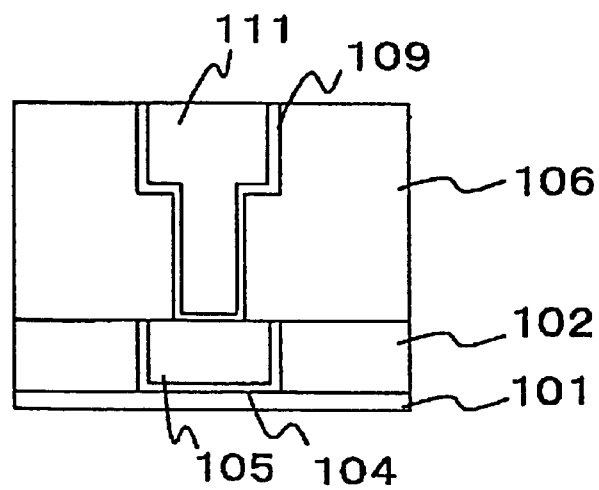
Figure 5:
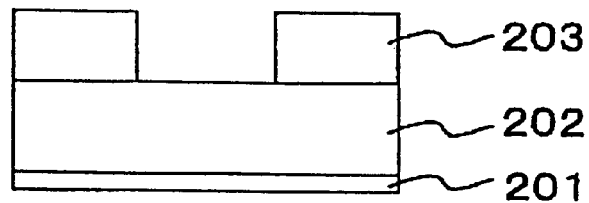
FIG. 5 is sectional views showing steps of a conventional method of manufacturing a semiconductor device.
Figure 5:
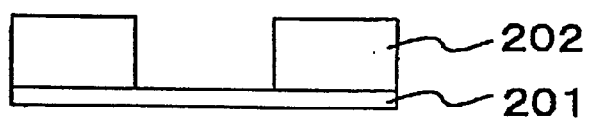
Figure 5:
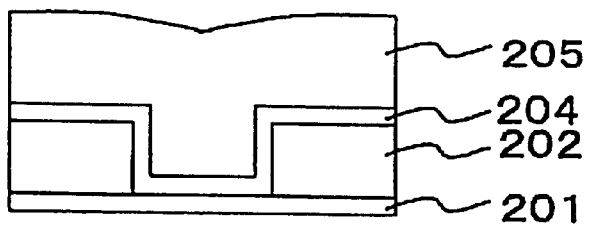
Figure 5:
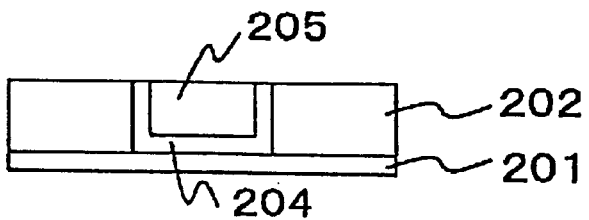
Figure 6:
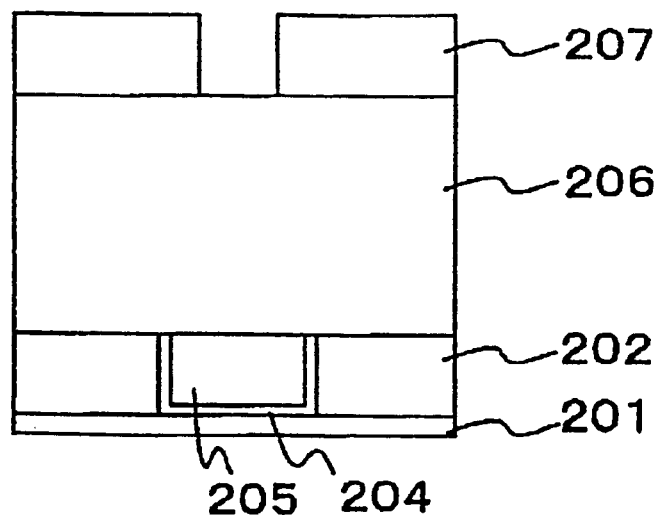
FIG. 6 is sectional views showing steps of a conventional method of manufacturing a semiconductor device.
Figure 6:
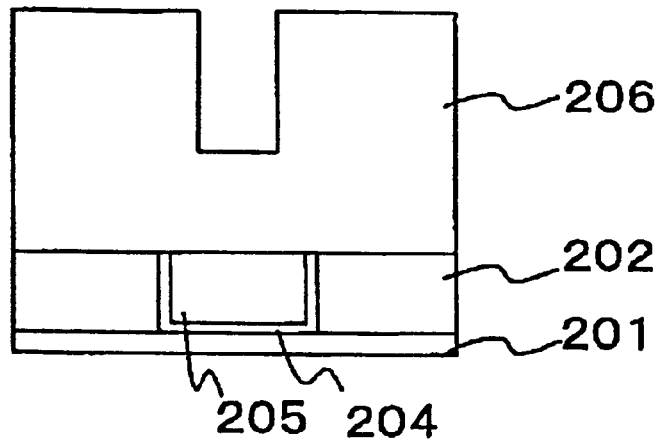
Figure 7:
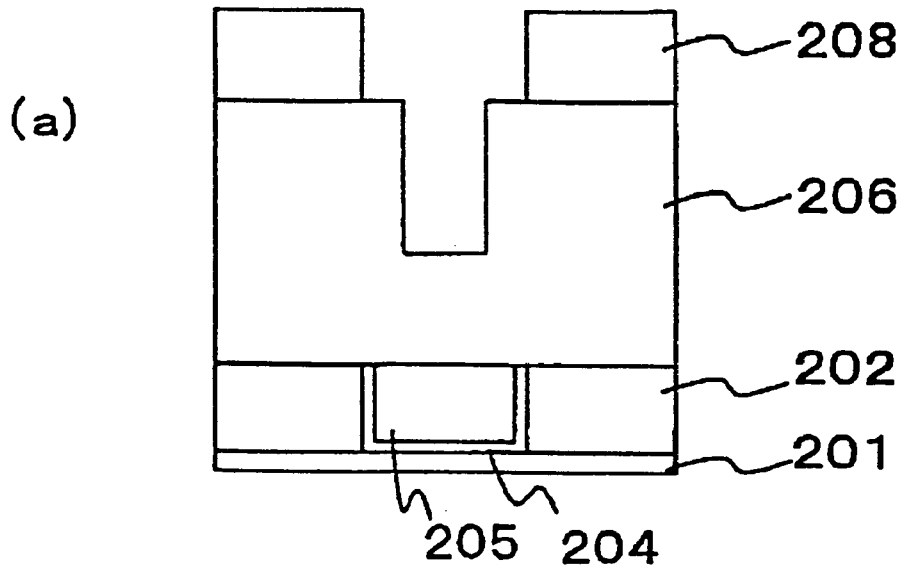
FIG. 7 is sectional views showing steps of a conventional method of manufacturing a semiconductor device.
Figure 7:
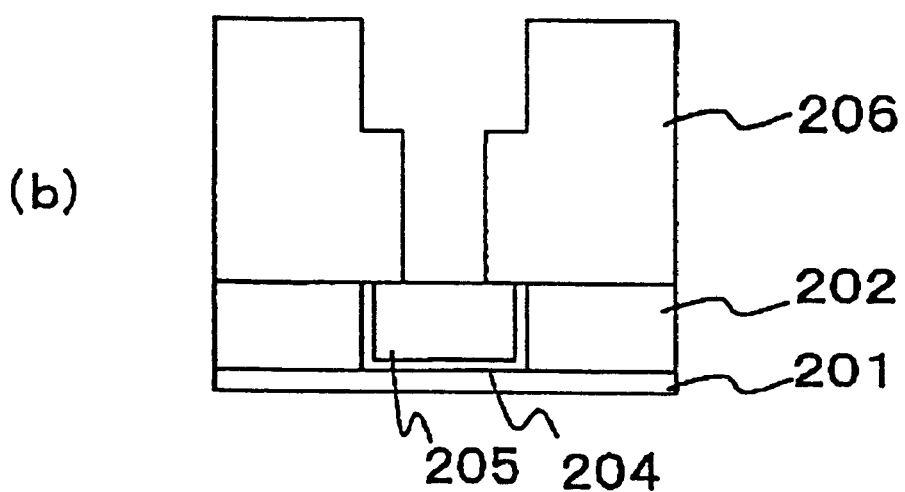
Figure 8:
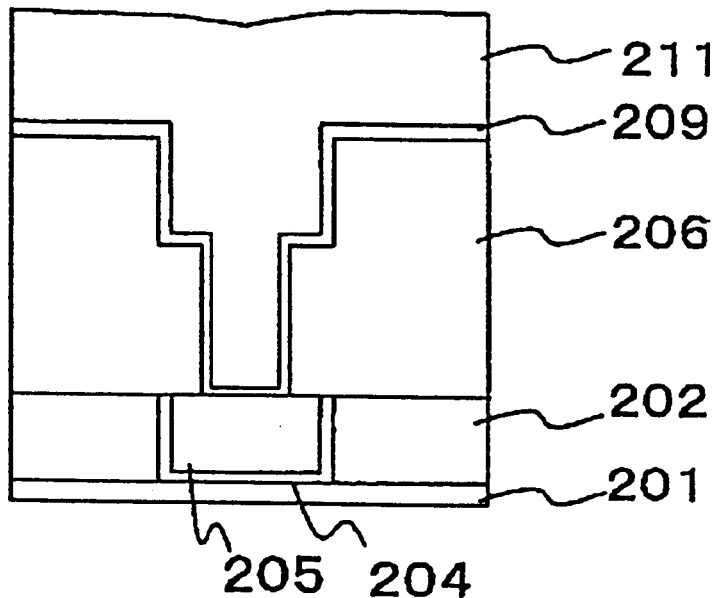
FIG. 8 is sectional views showing steps of a conventional method of manufacturing a semiconductor device.
Figure 8:
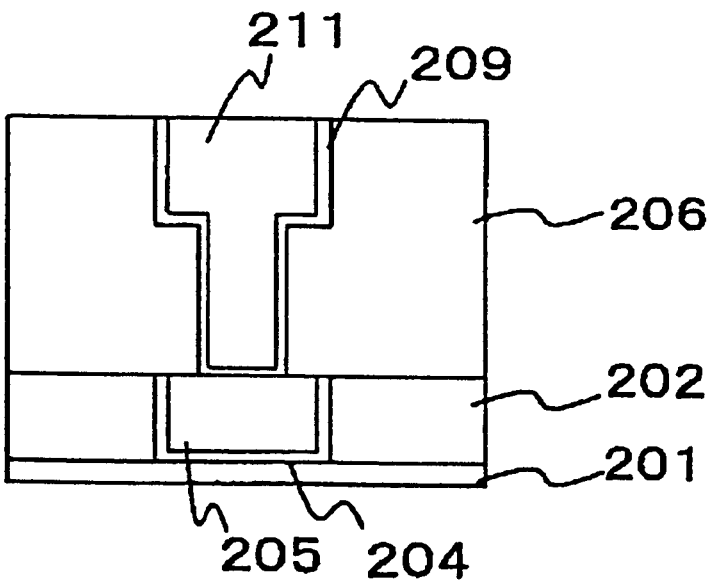
Figure 9:
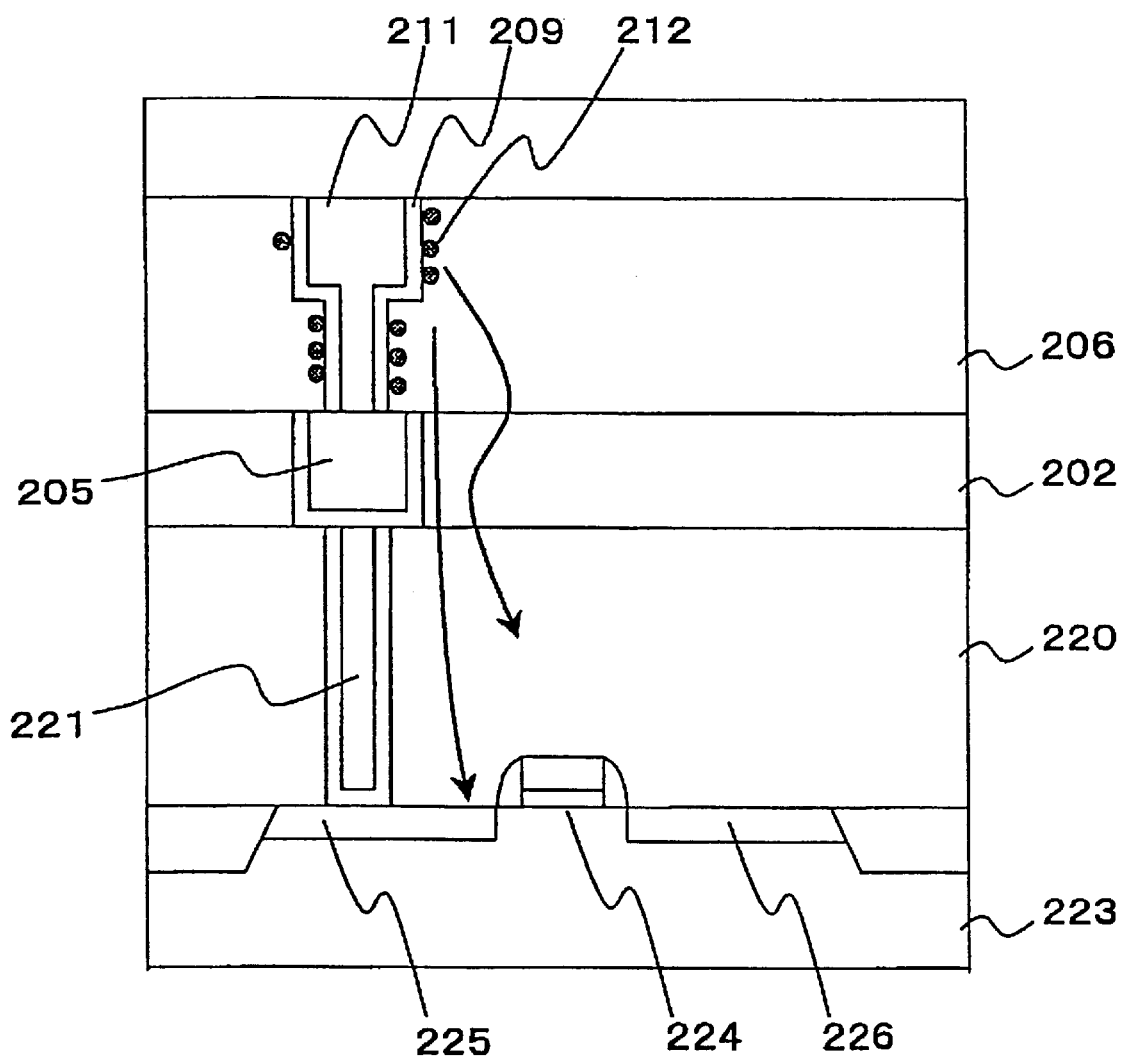
FIG. 9 is a drawing explaining problems present in a conventional method of manufacturing a semiconductor device.

In the step (A) of the present process, a metal wiring made of a metal material containing copper or a copper alloy is formed on a semiconductor substrate. The copper alloy refers to an alloy between copper and one metal selected from zirconium (Zr), tin (Sn), titanium (Ti) and aluminum (Al).

In the step (B) of the present process, an inter-layer insulating film is formed on the whole surface of the metal wiring. As the inter-layer insulating film, there can be used a conventional silicon oxide film or a low dielectric constant material such as SOG film or the like. There is no particular restriction as to the kind of the SOG film; as the SOG film, there can be used an inorganic SOG film, an organic SOG film, an HSQ (hydrogen silsesquioxane) film or the like. An HSQ film or an organic SOG film is preferred in view of the balance of dielectric constant, gas-generating property, etc. dielectric constant, gas-generating property, etc.

The HSQ film has a chemical structure of the following formula (1) and its dielectric constant is 2.8 to 3.1.

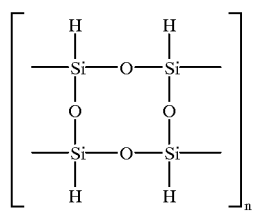

(I)

[In the formula (1), n is an integer.]

Meanwhile, the organic SOG film has a structure in which methyl group ($CH_3$—) or the like is bonded to silicon oxide. The relative dielectric constant of the organic SOG film is lower as the organic component content of the film is higher, and may be as low as about 2.1 to 2.7.

The thermal treatment of the SOG film formed by coating is ordinarily conducted in an inert gas atmosphere. When the SOG film is an HSQ film, the thermal treatment thereof may be conducted in an atmosphere containing neither oxygen nor water. The temperature of the thermal treatment is preferably 350 to 500° C. When the temperature is higher than 500° C., the chemical bond between Si and H is severed and the dielectric constant of the HSQ film may increase. When the temperature is lower than 350° C., the other insulating film formed on the SOG film may cause cracking.

In the step (C) of the present process, a via hole reaching the metal wiring is formed at a predetermined position of the inter-layer insulating film, by dry etching. There is no particular restriction as to the shape of the via hole, and the via hole may have a groove shape. The via hole includes a one-piece structure wherein a via hole and a groove for buried wiring is combined, which is formed by a so-called dual damascene process. This via hole is formed by dry etching. As the etching gas, there is used, for example, a mixed gas of Ar and a fluorine-based gas (e.g. $CHF_3$ or $C_4F_8$). The mixed gas may further contain $O_2$ as necessary.

In the step (D) of the present process, the contaminants which consist of the metal material and/or the compound(s) thereof and which have adhered to the inner wall of the via hole as a result of the dry etching, are removed by using a cleaning solution containing a complexing agent capable of forming a complex with the contaminants. As the complexing agent, there is used an agent capable of forming a complex with the metal contaminants which have adhered to the inner wall of the via hole. The complex refers to, for example, a chelate compound.

In the present invention, the chelating agent preferably contains at least one kind of compound selected from the group of three kinds of compounds consisting of (a) a polyaminocarboxylic acid, (b) a carboxylic acid excluding polyaminocarboxylic acids and (c) ammonium fluoride. By using such a chelating agent, the metal contaminants which have adhered to the inner wall of the via hole, can be removed effectively.

The polyaminocarboxylic acid (a) refers to a carboxylic acid having a plurality of amino groups and a plurality of carboxyl groups in the molecule, or a salt thereof. There can be mentioned, for example, compounds such as ethylenediaminetetraacetic acid (EDTA), trans-1,2-cyclohexanediaminetetraacetic acid (CyDTA), nitrilotriacetic acid (NTA), diethylenetriaminepentaacetic acid (DTPA), N-(2-hydroxyethyl)ethylenediamine-N,N',N'-triacetic acid (EDTA-OH) and the like; and salts thereof. When a salt is used, the salt is preferably one which does not adversely affect the properties of semiconductor device, particularly a metal-free salt such as ammonium salt. The amount of the polyaminocarboxylic acid or the ammonium fluoride used is preferably 1 to 1,000 ppm. When the amount is too small, no sufficient chelating effect is obtained. When the amount is too large, the compound remains on the surface of substrate and deteriorates the properties of semiconductor device, or a large cost is required for disposal of the used chelating agent.

As the carboxylic acid (b) excluding polyaminocarboxylic acids, there can be mentioned, for example, oxalic acid, citric acid, malic acid, maleic acid, succinic acid, tartaric acid, malonic acid, and salts thereof. When a salt is used, the salt is preferably one which does not adversely affect the properties of semiconductor device, particularly a metal-free salt such as ammonium salt. The amount of the carboxylic acid used is preferably 0.05 to 5%. When the amount is too small, no sufficient chelating effect is obtained. When the amount is too large, the compound remains on the surface of substrate and deteriorates the properties of semiconductor device, or a large cost is required for disposal of the used chelating agent.

In the present invention, when there is used a complexing agent containing both of the pblyaminocarboxylic acid (a) and the carboxylic acid (b) excluding polyaminocarboxylic acids, a higher effect for removal of metal contaminants can be obtained. The reason is not clear but is presumed to be that the polyaminocarboxylic acid and the carboxylic acid excluding polyaminocarboxylic acids are slightly different in the kinds of metal contaminants to which they are effective. It is thought that the metal contaminants generated as a result of dry etching are a mixture of a plurality of compounds. Therefore, when there is used a cleaning solution containing both of the polyaminocarboxylic acid and the carboxylic acid excluding polyaminocarboxylic acids, the two components act complementarily because they are effective to different contaminants, and contaminants consisting of a variety of metal compounds can be removed. When the two components (a) and (b) are used, each component is used in the same amount as mentioned above.

With respect to the action of the chelating agent, explanation is made on a case using oxalic acid. Oxalic acid can effectively form chelate complexes (e.g. $[Cu(COO)_4]^{2-}$) with the copper type contaminants (e.g. CuO and $CuO_2$) generated during the dry etching step for via hole formation. Meanwhile, oxalic acid forms substantially no chelate complex with the copper film which is a lower wiring, because the copper film has a metallic bond. Oxalic acid forms no chelate complex either with the barrier film consisting of TiN, Ta, TaN, TaSiN or the like. Therefore, the copper type contaminants remaining on the inner wall of via hole can beselectively removed without etching the copper wiring and the barrier film.

In the step (E) of the present process, a barrier metal film is formed on the inner wall of the via hole and then an electrically conductive film is formed on the whole surface of the resulting substrate so as to fill the via hole. As the material for the electrically conductive film, there is used tungsten, copper or the like. Meanwhile, the material for the barrier metal is appropriately selected depending upon the material for the electrically conductive film, and there is used Ti, TiN, Ta, TaN, TaSiN, W, WN or the like.

In the step (F) of the present process, the unnecessary portions of the electrically conductive film and the barrier metal film, formed outside the via hole are removed by etching or chemical mechanical polishing to obtain a flat surface. When copper is used for the electrically conductive film, use of chemical mechanical polishing is preferred.

In the present invention, prior to the step (D) of cleaning with a cleaning solution containing a complexing agent, for removal of contaminants which have adhered to the inner wall of the via hole, it is possible to clean the inner wall of the via hole using a cleaning solution containing an amine. This cleaning using a cleaning solution containing an amine, enables (1) peeling of the resist mask formed for via hole formation and (2) removal of the organic substances which have adhered to the inner wall of the via hole. Alternatively, a cleaning solution containing an amine may be added to the cleaning solution containing a chelating agent, and this can bring the shortening of semiconductor device production steps.

The present invention is described specifically below by way of Examples. However, the present invention is in no way restricted to these Examples alone.

EXAMPLE 1

The present Example is explained with reference to FIGS. 1 to 4. The present Example uses a damascene interconnections for each of the lower wiring and the upper wiring and employs a so-called dual damascene process.

(Formation of Lower Wiring)

First, a lower wiring was manufactured as follows. On a semiconductor substrate (not shown) on which a device (e.g. transistor) had been formed, were formed a silicon oxide film 101 having a thickness of 100 nm and an HSQ film 102 having a thickness of 400 nm. Successively, thereon was formed a photoresist mask 103 having a predetermined pattern [FIG. 1(a)]. Dry etching was conducted using the mask to form a groove for buried lower wiring, in the HSQ film 102. Successively, ashing by oxygen plasma and cleaning by a cleaning solution containing an amine compound were conducted to peel the photoresist mask 103 [FIG. 1(b)].

Then, on the whole surface of the resulting substrate was formed, by sputtering, a TiN film 104 (thickness: 50 nm) as a barrier metal film. Thereon was formed a copper film 105 by sputtering to fill the groove [FIG. 1(c)]. Successively, the unnecessary portions of the TiN film 104 and the copper film 105, formed outside the groove were removed by CMP to complete a lower wiring [FIG. 1(d)].

(Formation of Via Hole and Upper Wiring)

After the completion of the lower wiring, a material for HSQ film.was coated and then heat treatment was conducted on a hot place at 150° C., 200° C. and 350° C. in this order. Further, heat treatment was conducted in a nitrogen atmosphere at 400° C. for 60 minutes to form a HSQ film 106 having a thickness of 1,200 nm. Successively, thereon was formed a resist mask 107 having a pattern of via holes (diameter: 0.25 µm) [FIG. 2(a)].

Using this resist mask 107, dry etching was conducted to form part of a via hole in the HSQ film 106. The dry etching was stopped before the bottom of the via hole reached the copper film 105. As the etching gas, a mixed gas containing $C_4F_8$ and Ar was used. Successively, ashing by oxygen plasma and cleaning by a cleaning solution containing an amine compound were conducted to peel the resist mask 107 [FIG. 2(b)].

Then, a resist mask 108 was formed on the HSQ film 106 [FIG. 3(a)]. The width of the opening of the resist mask 108 was 0.3 µm which was larger than the diameter of each pore of the resist mask 107 of FIG. 2(a). Dry etching was conducted using this resist mask 108 to form a hole having a T-shaped section, in the HSQ film 106. As the etching gas, a mixed gas containing $C_4F_8$ and Ar was used. Successively, ashing by oxygen plasma and cleaning by a cleaning solution containing an amine compound were conducted to peel the resist mask 108 [FIG. 3(b)].

Subsequently, the inner wall of the hole having a T-shaped section was cleaned. There was used, as the cleaning solution, a solution obtained by adding 10 ppm of ethylenediaminetetraacetic acid (EDTA) to an aqueous solution containing 0.3% by weight of oxalic acid. The cleaning was carried out by immersing the above-obtained wafer subjected to various treatments, in the cleaning solution for 5 minutes. Then, the wafer was immersed in pure water for 5 minutes for rinsing.

Next, on the whole surface of the resulting wafer was formed, by sputtering, a TiN film 109 (thickness: 5 nm) as a barrier metal film. Thereon was formed a copper film 111 by sputtering, to fill the hole having a T-shaped section [FIG. 4(a)]. Successively, the unnecessary portions of the TiN film 109 and the copper film 111, formed outside the hole were removed by CMP to complete, an upper wiring and a via hole [FIG. 4(b)].

In the present Example, since a cleaning solution containing a chelating agent was used, the metal contaminants which had adhered to the inner wall of the via hole, could be removed effectively.

EXAMPLE 2

In the present Example, a silicon-nitride film was formed on a lower wiring to use it as an etching stopper at the time of via hole formation. Thereby, it was intended to suppress the etching of a lower wiring made of Cu and lower the amounts of metal contaminants adhering to the inner wall of a via hole. The production steps are described below with reference to the drawings.

Figure 10:
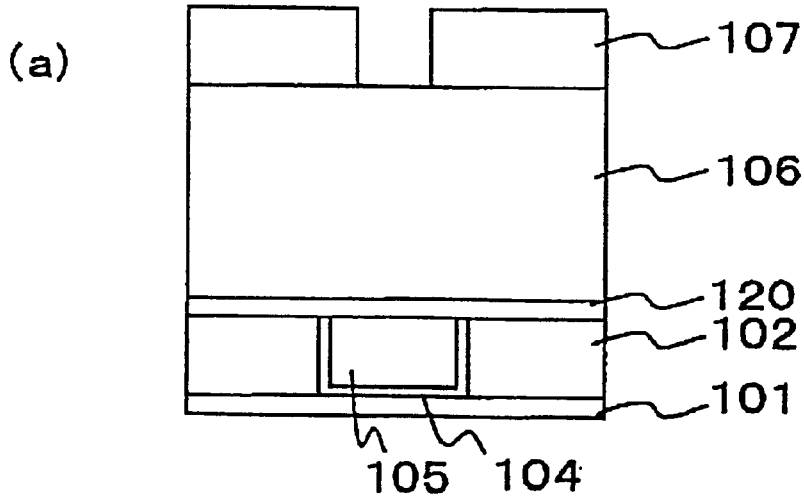
FIG. 10 is sectional views showing steps of the present method of manufacturing a semiconductor device.
Figure 10:
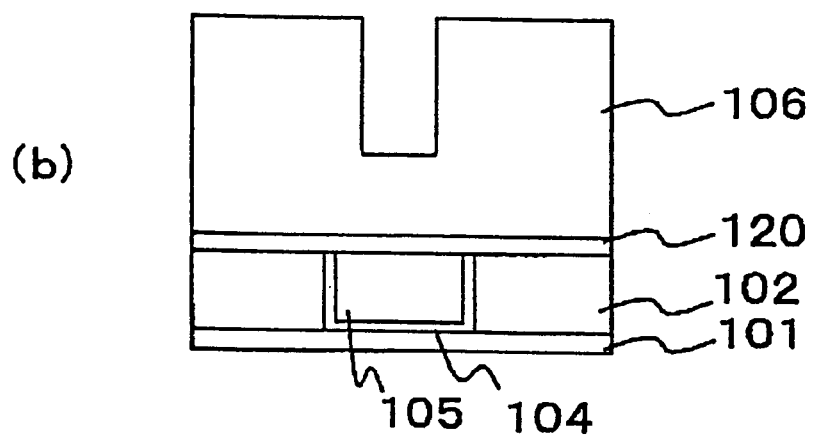

First, a lower wiring was formed in the same manner as in FIG. 1, as shown in FIGS. 1(a) to 1(d). Then, thereon was formed, by chemical vapor deposition (CVD), a silicon nitride film 120 having a thickness of 100 nm Further, a HSQ film 106 and a resist mask 107 were formed in the same manner as in Example 1 [FIG. 10(a)]. The diameter of each pore of the resist mask 107 was 0.25 μm.

Next, dry etching was conducted using the resist mask 107 to complete part of a via hole in the HSQ film 106. As the etching gas, a mixed gas containing $C_4F_8$ and Ar was used. The dry etching was stopped before the bottom of the hole to be formed reached the silicon nitride film 120. Successively, ashing by oxygen plasma and cleaning by a cleaning solution containing an amine compound were conducted to peel the resist mask 107 [FIG. 10(b)].

Figure 11:
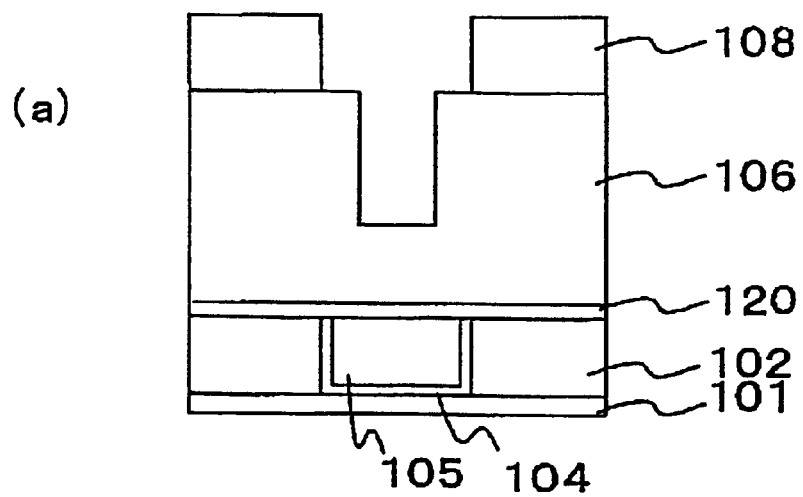
FIG. 11 is sectional views showing steps of the present method of manufacturing a semiconductor device.
Figure 11:
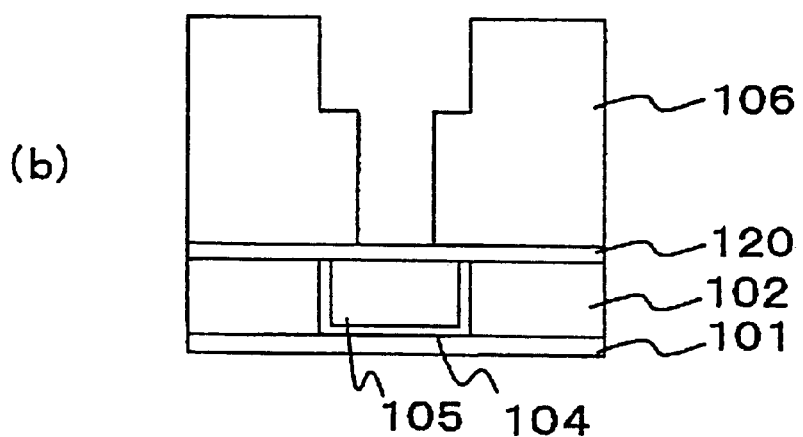
Figure 11:
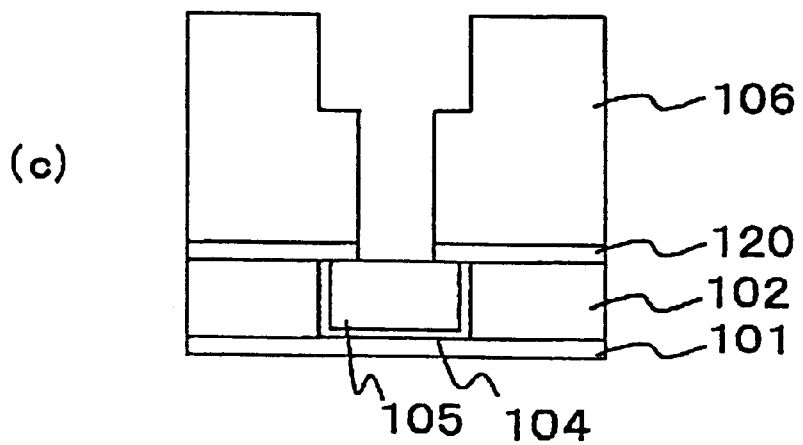

Then, a resist mask 108 was formed on the HSQ film 106 [FIG. 11(a)]. The width of the opening of the resist mask 108 was 0.3 μm which was larger than the diameter of each pore of the resist mask 107 of FIG. 10(a). Dry etching was conducted using this resist mask 108 to form a hole having a T-shaped section, in the HSQ film 106. As the etching gas, a mixed gas containing $C_4F_8$ and Ar was used. Since this mixed gas had a large etching rate ratio to the HSQ film 106 and the silicon nitride film 120 ((HSQ film:silicon nitride film=20:1), the etching was stopped at the upper surface of the silicon nitride film 120. Successively, ashing by oxygen plasma and cleaning by a cleaning solution containing an amine compound were conducted to peel the resist mask 108 [FIG. 11(b)].

In the above etching step, the copper film 104 is covered with the silicon nitride film 120 and is not exposed directly to the etching gas; therefore, the adhesion of the copper type metal contaminants generated by partial etching of the copper film 104, to the inner wall of via hole can be reduced.

Subsequently, the silicon nitride film 120 was dry-etched and the surface of the copper film 104 was exposed [FIG. 11(c)]. As the etching gas, a $CHF_3$ gas was used.

The later steps were conducted in the same manner as in Example 1. First, the inner wall of the hole having a T-shaped section was cleaned. As the cleaning solution, there was used a solution obtained by adding 10 ppm of ethylenediaminetetraacetic acid (EDTA) to an aqueous solution containing 0.3% by weight of oxalic acid. The cleaning was conducted by immersing the wafer subjected to the above-mentioned steps, in the cleaning solution for 5 minutes. Then, the wafer was immersed in pure water for 5 minutes for rinsing.

Figure 12:
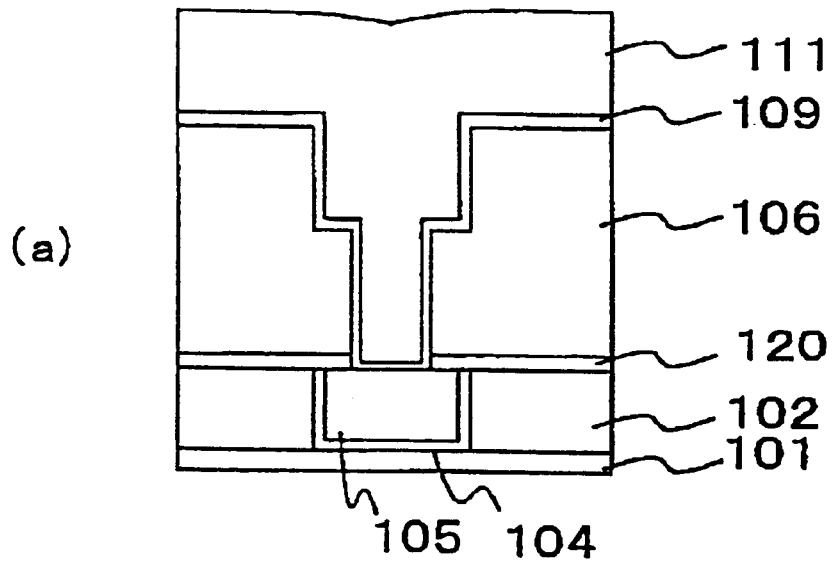
FIG. 12 is sectional views showing steps of the present method of manufacturing a semiconductor device.
Figure 12:
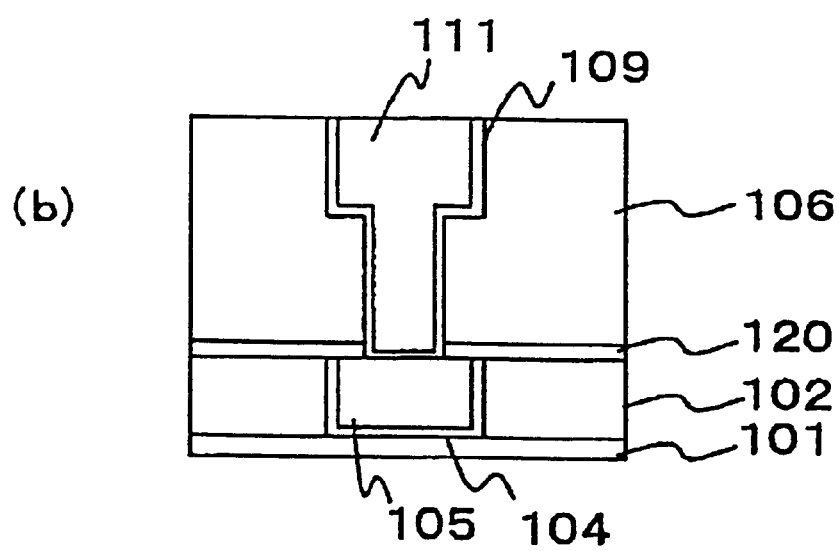

Then, a TiN film 109 and a tungsten film 111 were formed [FIG. 12(a)], followed by surface flattening by CMP, to complete a multi-layer interconnection [FIG. 12(b)].

Comparative Example 1

A multi-layer interconnection was formed in the same manner as in Example 1 except that the cleaning of the inner wall of via hole using an aqueous oxalic acid solution containing EDTA was not conducted in the state of FIG. 3(b) of Example 1.

Comparative Example 2

A multi-layer interconnection was formed in the same manner as in Example 1 except that cleaning of the inner wall of via hole using DHF (dilute hydrofluoric acid) was conducted in the state of FIG. 3(b) of Example 1.

The via holes manufactured in the above Examples and Comparative Examples were measured for the amount of metal contaminants adhering to the inner wall of via hole, the change in hole diameter, and the leakage current of multi-layer interconnection.

Figure 13:
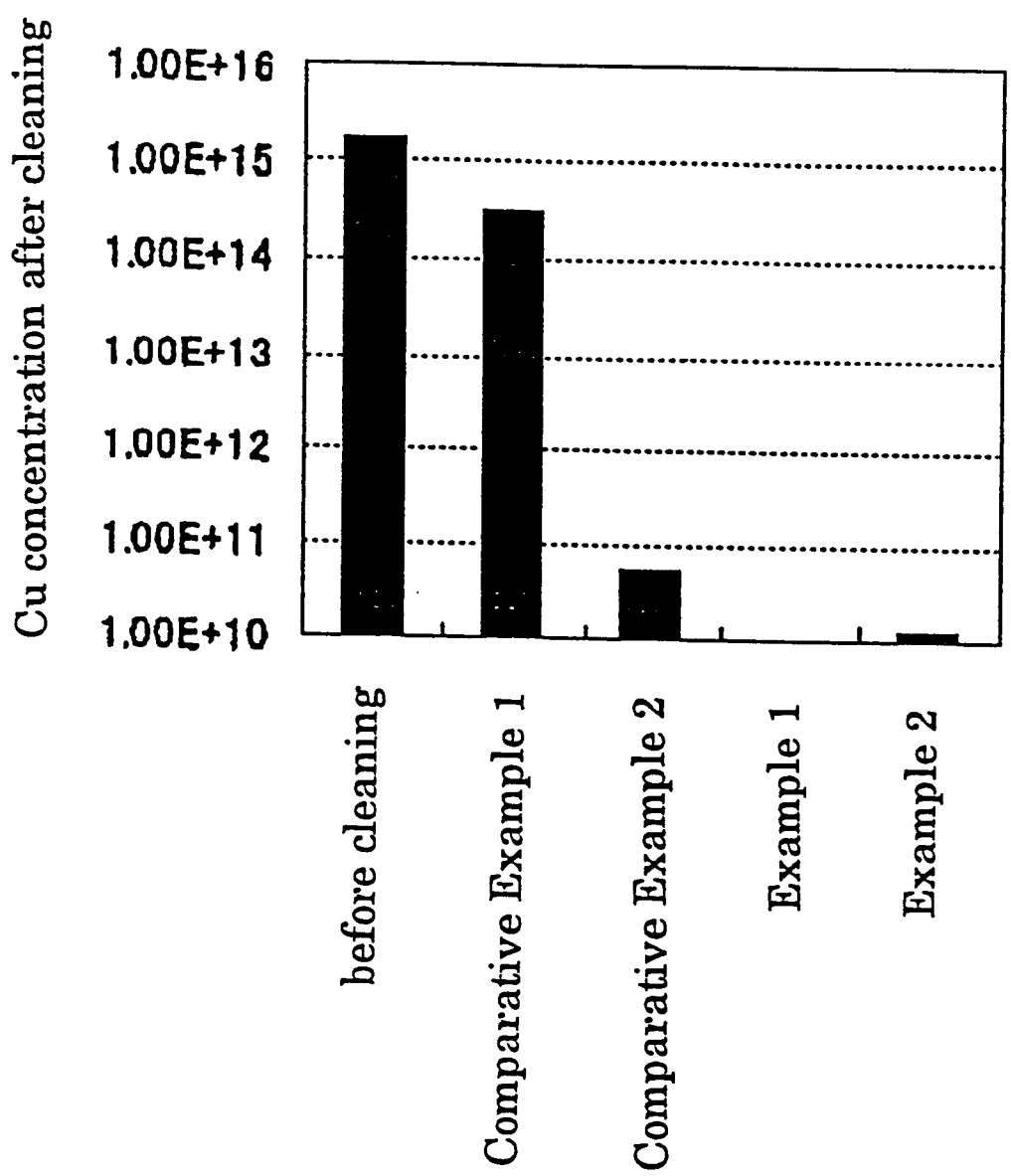
FIG. 13 is a graph showing the Cu contaminations after cleaning treatment in Examples and Comparative Examples.

As described above, in Examples 1 and 2 and Comparative Example 2, there were conducted, after the formation of a via hole having a T-shaped section, (1) cleaning using a cleaning solution containing an amine compound and further (2) cleaning using a complexing agent or DHF. Meanwhile, in Comparative Example 1, there was conducted, after the formation of a via hole, only cleaning using a cleaning solution containing an amine compound. After these cleanings, the amount of copper type metal contaminants present in via hole was measured and the result is shown in FIG. 13. The measurement was conducted by examining the amount of copper type contaminants adhering to the inner wall of via hole, by XPS (X-ray photo emission spectroscopy). In the XPS, an X-ray is applied to the via hole from an oblique direction (this eliminates the influence of copper at the bottom of the via hole and only the copper adhering to the insulting film of the via hole is charged up and shifted) and the amount of adhered copper is measured. As is clear from the results shown in FIG. 13, metal contaminants were effectively removed in Examples 1 and 2.

Figure 14:
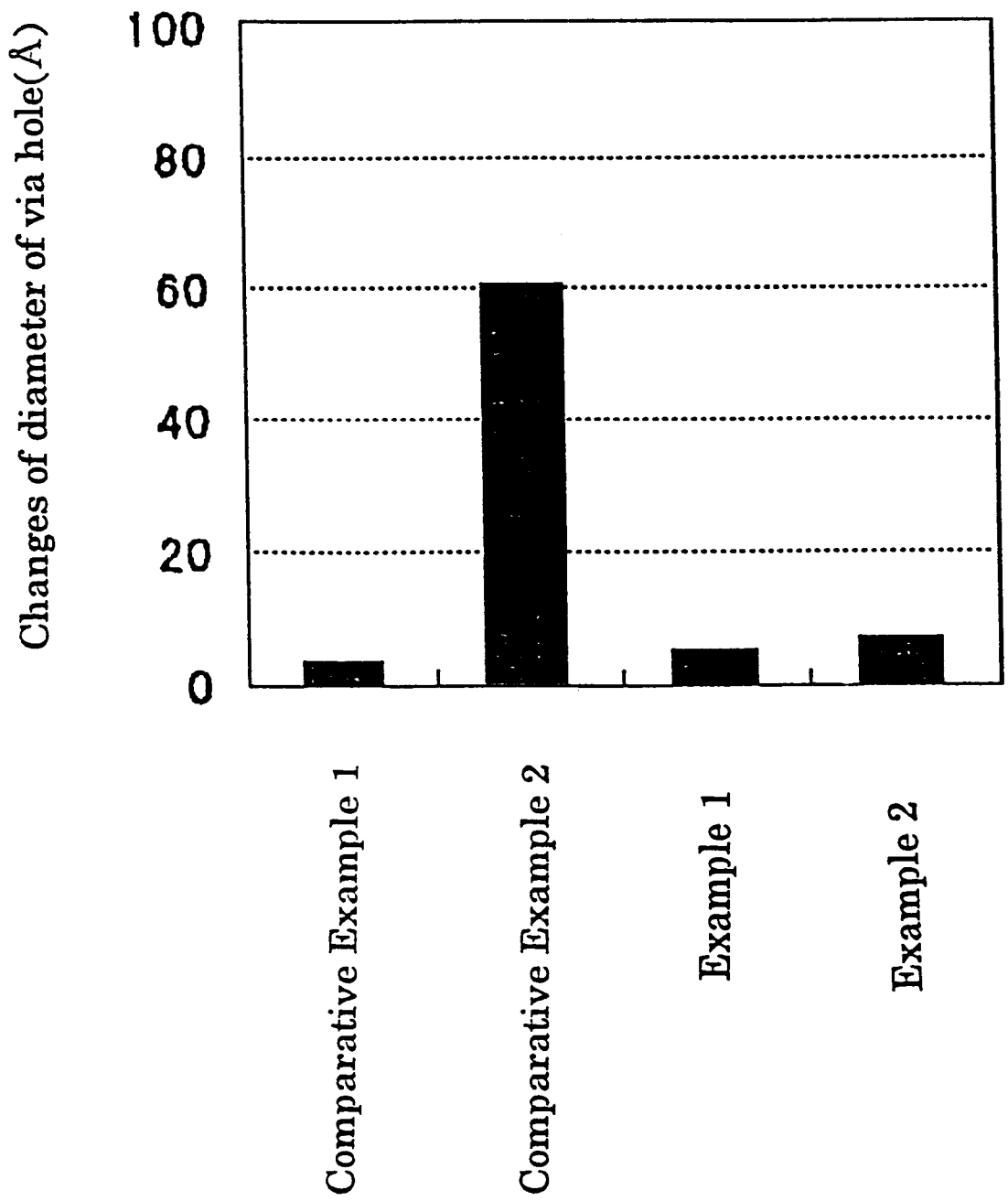
FIG. 14 is a graph showing the changes in hole diameter before and after cleaning treatment in Examples and Comparative Examples.

FIG. 14 is a graph. showing the changes in hole. diameter before and after cleaning treatment in Examples and Comparative Examples. It was confirmed that use of DHF (dilute hydrofluoric acid) gives a large change in hole diameter.

Figure 15:
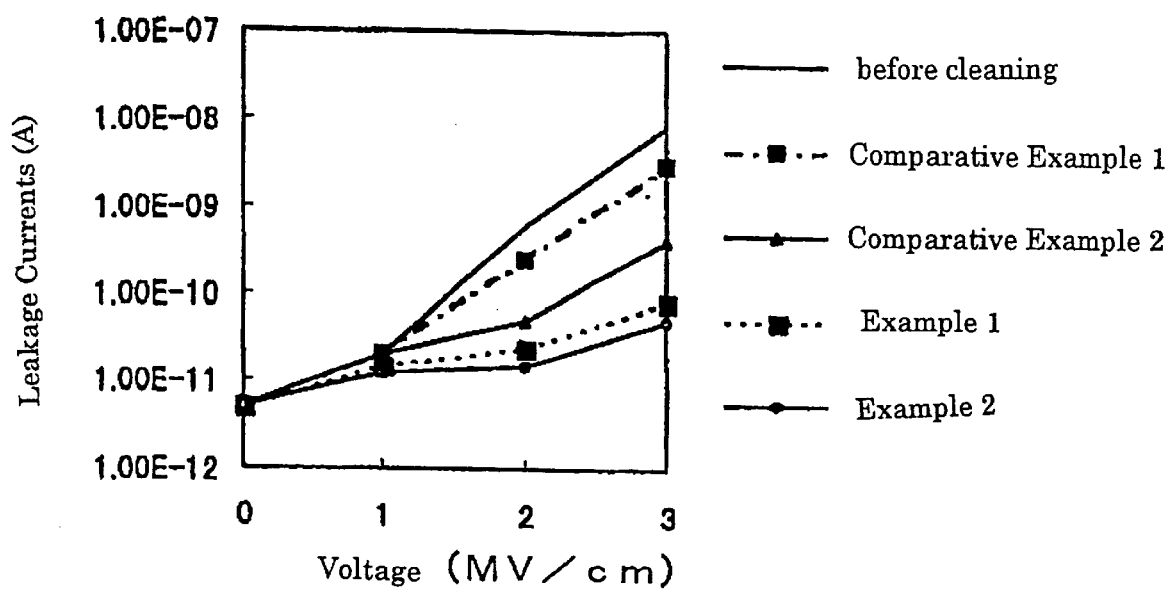
FIG. 15 is a graph showing the measured leakage currents of the semiconductor devices manufactured in Examples and Comparative Examples.
Figure 16:
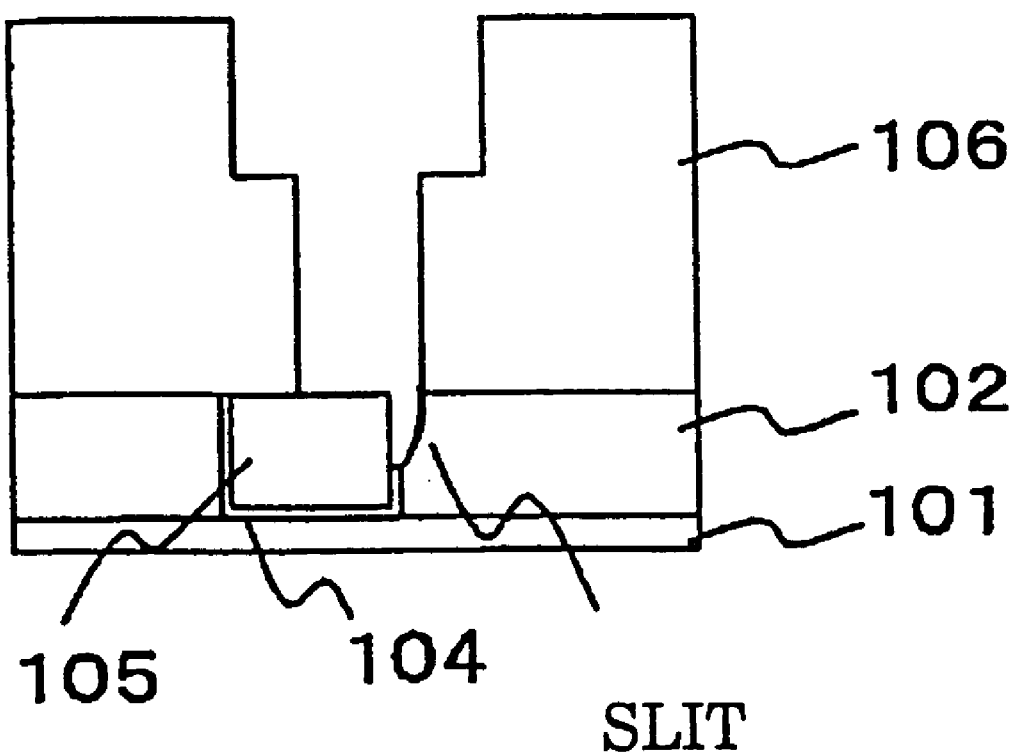
FIG. 16 is a drawing showing a state in which a slit is formed at the side of a lower wiring.

FIG. 15 is a graph showing the leakage currents measured for the semiconductor devices of multi-layer interconnection type manufactured in Examples and Comparative Examples. Each leakage current was measured by forming each one copper wiring in two HSQ films at a given interval, applying a voltage to these copper wirings, and measuring the amount of electricity which flowed. The leakage current is small in Examples 1 and 2 having small metal contaminants.

As described above, the method of manufacturing a semiconductor device according to the present invention comprises a step of cleaning the inside of a via hole using a cleaning solution containing a complexing agent capable of forming a complex with copper type metal contaminants; therefore, the present process can sufficiently remove the copper type contaminants adhering to the inner walls of a via hole and a groove for buried wiring. As a result, there can be alleviated problems of current leakage in multi-layer interconnection and malfunctioning of device.

This application is based on Japanese application NO.HEI10-282863, the content of which is incorporated hereinto by reference.

What is claimed is:

1. A method of manufacturing a semiconductor device comprising the steps of:
   (A) a step of forming, on a semiconductor substrate, a metal wiring made of a metal material containing copper or a copper alloy,
   (B) a step of forming an inter-layer insulating film on the metal wiring, (C) a step of forming, in the inter-layer insulating film, a via hole reaching the metal wiring by dry etching, (D) a step of removing contaminants which consist of the metal material and/or the compound(s) thereof and which have adhered to the inner wall of the via hole as a result of the dry etching, by using a cleaning solution consisting essentially of water and a complexing agent capable of forming a complex with the contaminants, (E) a step of forming a barrier metal film on the inner wall of the via hole and then forming an electrically conductive film on the whole surface of the resulting substrate so as to fill the via hole, and (F) a step of removing the unnecessary portions of the electrically conductive film and the barrier metal film, formed outside the via hole, by etching or chemical mechanical polishing to obtain a flat surface.

2. A method according to claim 1, wherein the inter-layer insulating film is a SOG (Spin On Glass) film.

3. A method according to claim 1, wherein the inter-layer insulating film is a HSQ (Hydrogen Silsesquioxane) film.

4. A method according to claim 1, which further comprises between the step (C) and the step (D)

a step of cleaning the inner wall of the via hole using a cleaning solution containing an amine compound.

5. A method according to claim 1, wherein the cleaning solution contains therein a cleaning solution containing an amine compound.

6. A method according to claim 1, wherein the complexing agent contains (a) a polyaminocarboxylic acid and (b) a carboxylic acid excluding polyaminocarboxylic acids.

7. A method according to claim 1, wherein the complexing agent contains at least one kind of compound selected from the group of three kinds of compounds consisting of (a) a polyaminocarboxylic acid, (b) a carboxylic acid excluding polyaminocarboxylic acids and (c) ammonium fluoride.

8. A method according to claim 7, wherein the polyaminocarboxylic acid (a) is ethylenediaminetetraacetic acid, trans-1,2-cyclohexanediaminetetraacetic acid, nitrilotriacetic acid, diethylenetriaminepentaacetic acid, N-(2-hydroxyethyl)ethylenediamine-N,N',N'-triacetic acid, or a salt thereof.

9. A method according to claim 7, wherein the carboxylic acid (b) excluding polyaminocarboxylic acids is oxalic acid, citric acid, malic acid, maleic acid, succinic acid, tartaric acid, malonic acid, or a salt thereof.

10. A method of manufacturing a semiconductor device having a copper wiring, which comprises, after formation of a via hole, cleaning the inside of the via hole using a cleaning solution consisting essentially of water and a complexing agent capable of forming a complex with contaminants of copper type metals.

* * * * *